(12) United States Patent
Kitagawa et al.

(10) Patent No.: US 12,080,673 B2
(45) Date of Patent: Sep. 3, 2024

(54) SEMICONDUCTOR DEVICE AND MANUFACTURING METHOD THEREFOR

(71) Applicant: Mitsubishi Electric Corporation, Tokyo (JP)

(72) Inventors: Tatsuya Kitagawa, Tokyo (JP); Shin Uegaki, Tokyo (JP); Masao Akiyoshi, Tokyo (JP); Masaaki Taruya, Tokyo (JP); Dai Yoshii, Tokyo (JP); Kazuhiro Tada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 20 days.

(21) Appl. No.: 17/388,179

(22) Filed: Jul. 29, 2021

(65) Prior Publication Data

US 2022/0262761 A1    Aug. 18, 2022

(30) Foreign Application Priority Data

Feb. 17, 2021    (JP) .................................. 2021-023030

(51) Int. Cl.
*H01L 23/00*      (2006.01)
*H01L 21/321*      (2006.01)
(Continued)

(52) U.S. Cl.
CPC ............ *H01L 24/32* (2013.01); *H01L 21/321* (2013.01); *H01L 21/565* (2013.01);
(Continued)

(58) Field of Classification Search
None
See application file for complete search history.

(56) References Cited

U.S. PATENT DOCUMENTS 11,362,012 B2 *    6/2022    Okura .................... H01L 29/78
2011/0073577 A1    3/2011    Tamura et al.
(Continued)

FOREIGN PATENT DOCUMENTS

CN      107004662 A    8/2017
JP      4941532 B2    5/2012
(Continued)

OTHER PUBLICATIONS

Communication dated Jun. 28, 2022 from the Japanese Patent Office in Japanese Application No. 2021-023030.
(Continued)

*Primary Examiner* — Telly D Green
(74) *Attorney, Agent, or Firm* — Sughrue Mion, PLLC; Richard C. Turner

(57) ABSTRACT

The semiconductor device includes: a semiconductor element including a body portion formed in a plate shape, a protection film provided at an outer periphery on one surface of the body portion, and a metal thin film provided adjacently to an inner side of the protection film on the one surface of the body portion; a metal member joined to a surface of the metal thin film on a side opposite to the body portion, by solder; and a mold resin sealing the semiconductor element and the metal member, wherein the surface of the metal thin film on the side opposite to the body portion has, on at least a part of an outer periphery thereof, a projection portion projecting from the surface of the metal thin film, and the solder is not provided on an outer peripheral side from a top of the projection portion.

8 Claims, 8 Drawing Sheets

(51) Int. Cl.
  *H01L 21/56*    (2006.01)
  *H01L 23/31*    (2006.01)
  *H01L 23/495*   (2006.01)

(52) U.S. Cl.
  CPC .... *H01L 23/3142* (2013.01); *H01L 23/49562* (2013.01); *H01L 23/49568* (2013.01); *H01L 23/49575* (2013.01); *H01L 24/83* (2013.01); H01L 2224/26145 (2013.01); H01L 2224/32245 (2013.01); H01L 2224/83815 (2013.01); H01L 2924/182 (2013.01); H01L 2924/18301 (2013.01); H01L 2924/351 (2013.01)

(56) References Cited

U.S. PATENT DOCUMENTS

| | | | |
|---|---|---|---|
| 2017/0148718 A1* | 5/2017 | Morita | H01L 21/4846 |
| 2017/0278774 A1 | 9/2017 | Hayashi et al. | |
| 2019/0355656 A1* | 11/2019 | Hayashi | H01L 23/40 |
| 2021/0028085 A1* | 1/2021 | Okura | H01L 23/3157 |

FOREIGN PATENT DOCUMENTS

| | | |
|---|---|---|
| JP | 6578900 B2 | 9/2019 |
| JP | 2019-201160 A | 11/2019 |
| JP | 2019-212808 A | 12/2019 |

OTHER PUBLICATIONS

Communication dated Apr. 19, 2022 from the Japanese Patent Office in Japanese Application No. 2021-023030.
German Office Action issued Mar. 7, 2024 in Patent Application No. 10 2021 210 033.3.
Chinese Office Action dated May 10, 2024 in Application No. 202210104482.X.

* cited by examiner

FIG. 7

| ENERGY DENSITY J/cm² | 0 | 1 | 2.5 | 5 | 10 | 15 | 20 | 25 | 40 | 80 | 85 | 100 |
|---|---|---|---|---|---|---|---|---|---|---|---|---|
| SUPPRESSION OF SOLDER WETTING | × | △ | △ | △ | ○ | ○ | ○ | ○ | ○ | ○ | ○ | ○ |
| DAMAGE OF SEMICONDUCTOR ELEMENT | ○ | ○ | ○ | ○ | ○ | ○ | ○ | ○ | ○ | ○ | × | × |
| ELECTRIC PROPERTY | ○ | ○ | ○ | ○ | ○ | ○ | ○ | ○ | ○ | ○ | × | × |

SEMICONDUCTOR DEVICE AND MANUFACTURING METHOD THEREFOR

BACKGROUND OF THE INVENTION

1. Field of the Invention

The present disclosure relates to a semiconductor device and a manufacturing method therefor.

2. Description of the Background Art

A semiconductor device is formed such that a semiconductor element is joined to a conductive member such as metal by solder and the semiconductor element and the conductive member are sealed with a mold resin. In general, solder placed between a chip-shaped semiconductor element and a conductive member is temporarily melted to join the semiconductor element and the conductive member to each other. A part of the semiconductor element that is joined to the conductive member is, for example, an electrode material which is a metal thin film provided to a front surface electrode of the semiconductor element. An insulating protection film is provided at the outer periphery of the front surface electrode of the semiconductor element. The protection film has a function of keeping insulation of the front surface electrode and ensuring the withstand voltage of the semiconductor element.

Thus, there is a multiplex point where a plurality of different materials (the solder, the electrode material, and the protection film in the above configuration) are in contact with each other, at the outer periphery of the front surface electrode of the semiconductor element soldered. At the multiplex point, great stress is locally applied during usage of the semiconductor device, due to difference in the linear expansion coefficients of the respective materials. When great stress is locally applied, the joined part might be peeled or damaged. Therefore, for relaxing the stress that occurs, technology for controlling the spreading base shape (so-called fillet shape) of solder is disclosed (see, for example, Patent Document 1).

In a semiconductor device with a conductive member and a semiconductor element joined to each other by solder, a laser beam is applied to a first area of a metal film of the conductive member, whereby solder wettability is reduced on the first area and a third area adjacent to the first area. Through formation of such areas where solder wettability is reduced on the conductive member, the fillet shape of solder on the semiconductor element side is controlled. Thus, the fillet angle on the semiconductor element side can be inhibited from becoming 90 degrees or greater due to the solder wetting and spreading on the metal film of the conductive member.

Patent Document 1: Japanese Laid-Open Patent Publication No. 2019-212808

In Patent Document 1, the fillet shape of solder on the semiconductor element surface can be controlled at the multiplex point, whereby stress at the multiplex point can be relaxed. However, the areas where solder wettability is reduced are provided on the conductive member opposed to the semiconductor element, for controlling the fillet shape on the semiconductor element. Therefore, if the position of the conductive member or solder deviates, the fillet shape on the semiconductor element side cannot be fully controlled, thus causing a problem that a satisfactory stress relaxing effect cannot be obtained. In addition, the multiplex point at the outer periphery of the semiconductor element still remains, and thus there is a problem that the stress relaxing effect cannot be obtained sufficiently.

SUMMARY OF THE INVENTION

Accordingly, an object of the present disclosure is to obtain a semiconductor device and a manufacturing method therefor that suppress solder wetting and avoid formation of the multiplex point.

A semiconductor device according to the present disclosure includes: a semiconductor element including a body portion formed in a plate shape, a protection film provided at an outer periphery on one surface of the body portion, and a metal thin film provided adjacently to an inner side of the protection film on the one surface of the body portion; a metal member joined to a surface of the metal thin film on a side opposite to the body portion, by solder; and a mold resin sealing the semiconductor element and the metal member, wherein the surface of the metal thin film on the side opposite to the body portion has, on at least a part of an outer periphery thereof, a projection portion projecting from the surface of the metal thin film, and the solder is not provided on an outer peripheral side from a top of the projection portion.

A semiconductor device manufacturing method according to the present disclosure includes: a member preparing step of preparing a semiconductor element including a body portion formed in a plate shape, a protection film provided at an outer periphery on one surface of the body portion, and a metal thin film provided adjacently to an inner side of the protection film on the one surface of the body portion, a metal member for connecting the semiconductor element and outside, and a mold resin for sealing the semiconductor element and the metal member; a projection portion forming step of, on at least a part of an outer periphery on a surface of the metal thin film on a side opposite to the body portion, forming a projection portion projecting from the surface of the metal thin film; a soldering step of joining the metal member to the surface of the metal thin film on an inner side from a top of the projection portion, via solder; and a sealing step of sealing the semiconductor element and the metal member by the mold resin.

In the semiconductor device according to the present disclosure, the metal member and the semiconductor element including the body portion, the protection film provided at the outer periphery on the one surface of the body portion, and the metal thin film provided adjacently to the inner side of the protection film on the one surface of the body portion, are joined to each other by solder. The surface of the metal thin film on the side opposite to the body portion has, on at least a part of the outer periphery thereof, the projection portion projecting from the surface of the metal thin film, and the solder is not provided on the outer peripheral side from the top of the projection portion. Thus, wetting and spreading of the solder to the outer peripheral side from the top of the projection portion are suppressed, whereby it is possible to avoid formation of a multiplex point where great stress is likely to occur due to heat generation.

The semiconductor device manufacturing method according to the present disclosure includes: the member preparing step of preparing the semiconductor element including the body portion formed in a plate shape, the protection film provided at the outer periphery on the one surface of the body portion, and the metal thin film provided adjacently to the inner side of the protection film on the one surface of the body portion, the metal member for connecting the semiconductor element and outside, and the mold resin for sealing the semiconductor element and the metal member; the projection portion forming step of, on at least a part of the outer periphery on the surface of the metal thin film on the side opposite to the body portion, forming the projection portion projecting from the surface of the metal thin film; the soldering step of joining the metal member to the surface of the metal thin film on the inner side from the top of the projection portion, by solder; and the sealing step of sealing the semiconductor element and the metal member by the mold resin. Thus, in the semiconductor device, the solder is not provided on the outer peripheral side from the top of the projection portion, so that wetting and spreading of the solder to the outer peripheral side from the top of the projection portion are suppressed, whereby it is possible to avoid formation of a multiplex point where great stress is likely to occur due to heat generation.

BRIEF DESCRIPTION OF THE DRAWINGS

FIG. 7 shows an evaluation result for a semiconductor device in Example; and

DETAILED DESCRIPTION OF THE PREFERRED EMBODIMENTS OF THE INVENTION

Figure 1:
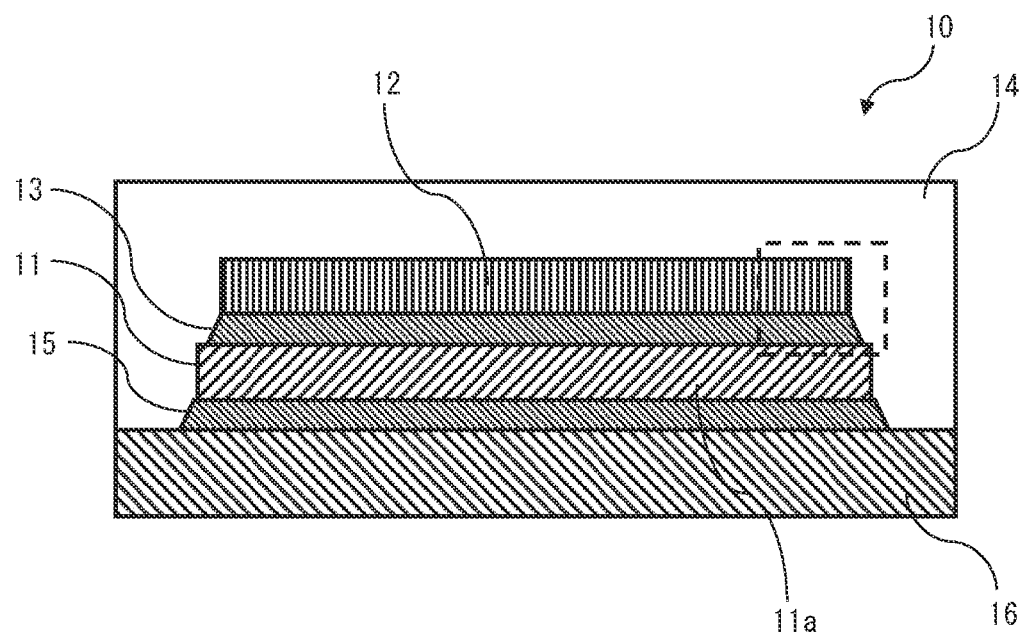
FIG. 1 is a sectional view schematically showing a semiconductor device according to the first embodiment of the present disclosure.

Hereinafter, a semiconductor device and a manufacturing method therefor according to an embodiment of the present disclosure will be described with reference to the drawings. In the drawings, the same or corresponding members and parts are denoted by the same reference characters, to give description. In addition, for clarifying the description, the drawings are simplified as appropriate.

First Embodiment

Figure 2:
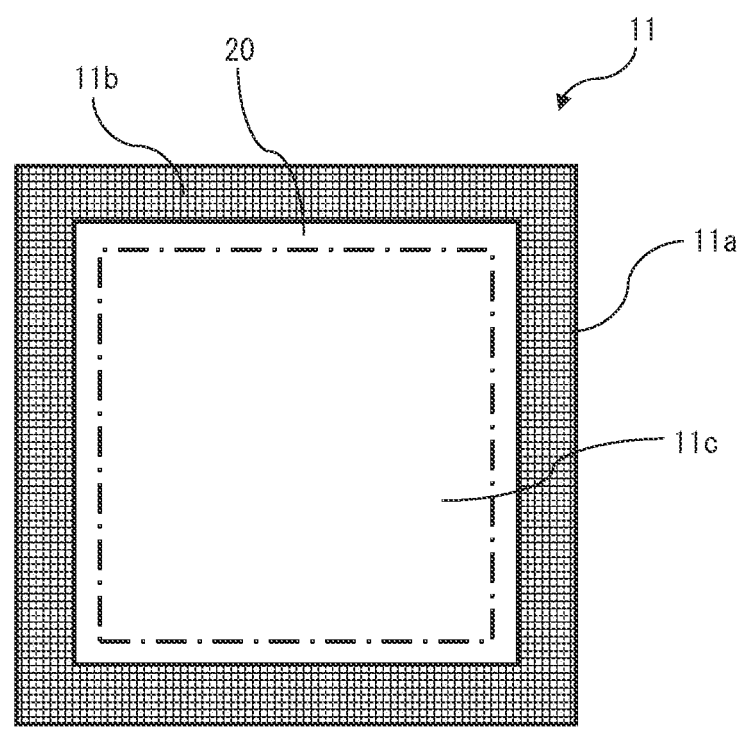
FIG. 2 is a plan view schematically showing a semiconductor element of the semiconductor device according to the first embodiment.
Figure 3:
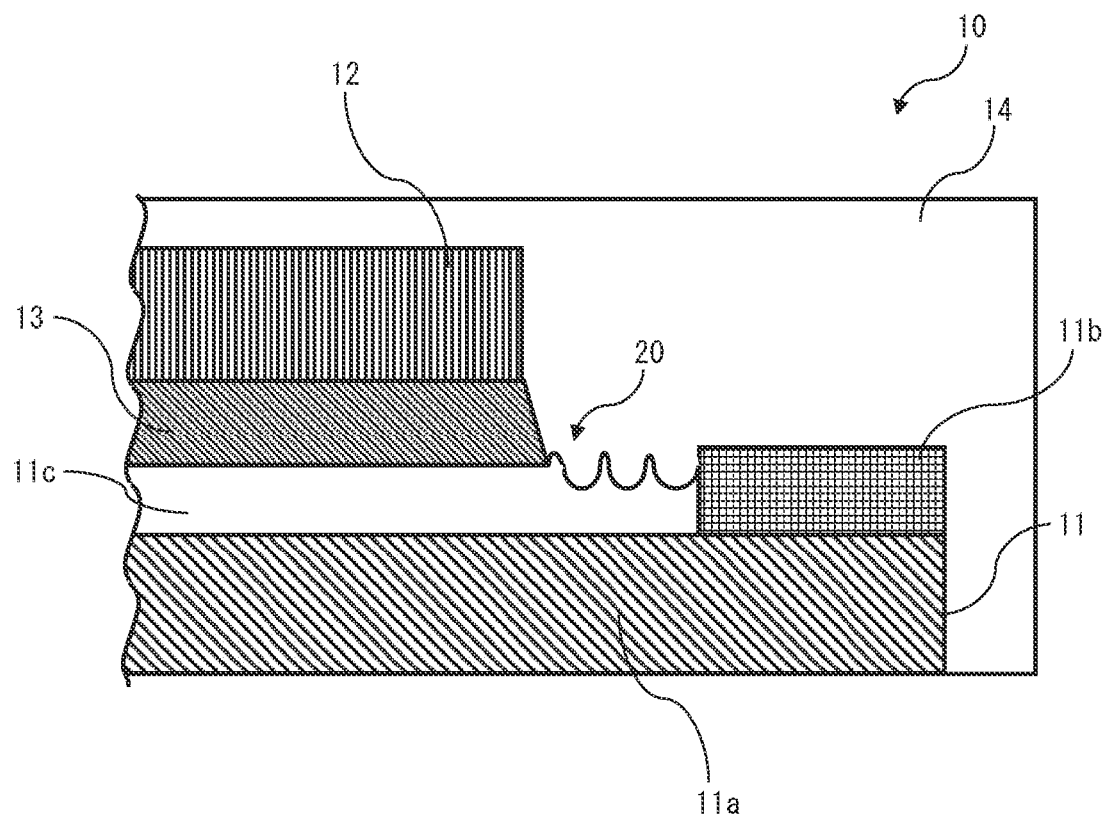
FIG. 3 is a sectional view showing a specific part of the semiconductor device according to the first embodiment.
Figure 4:
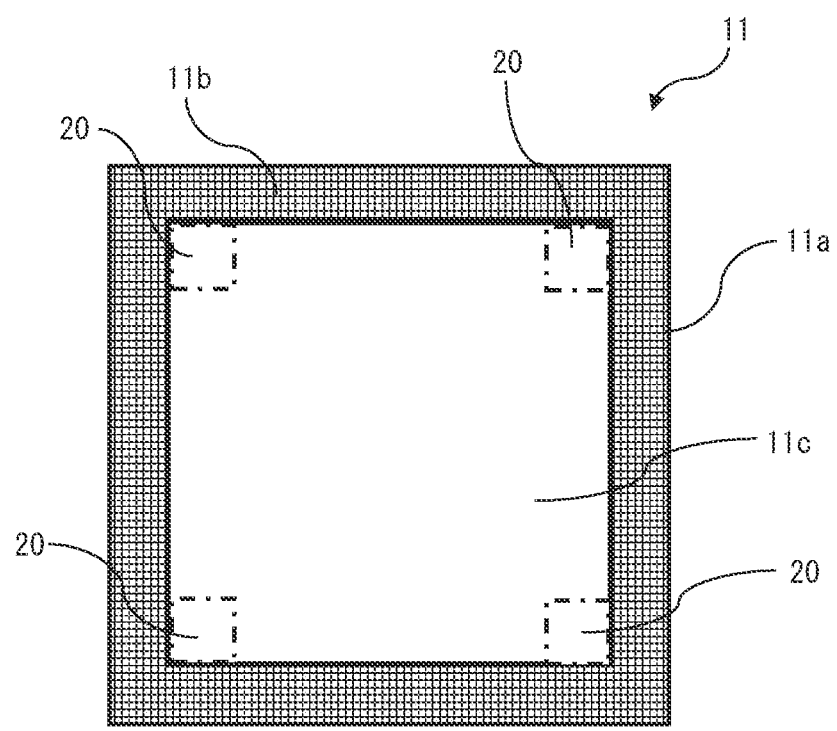
FIG. 4 is a plan view schematically showing another semiconductor element of the semiconductor device according to the first embodiment.
Figure 5:
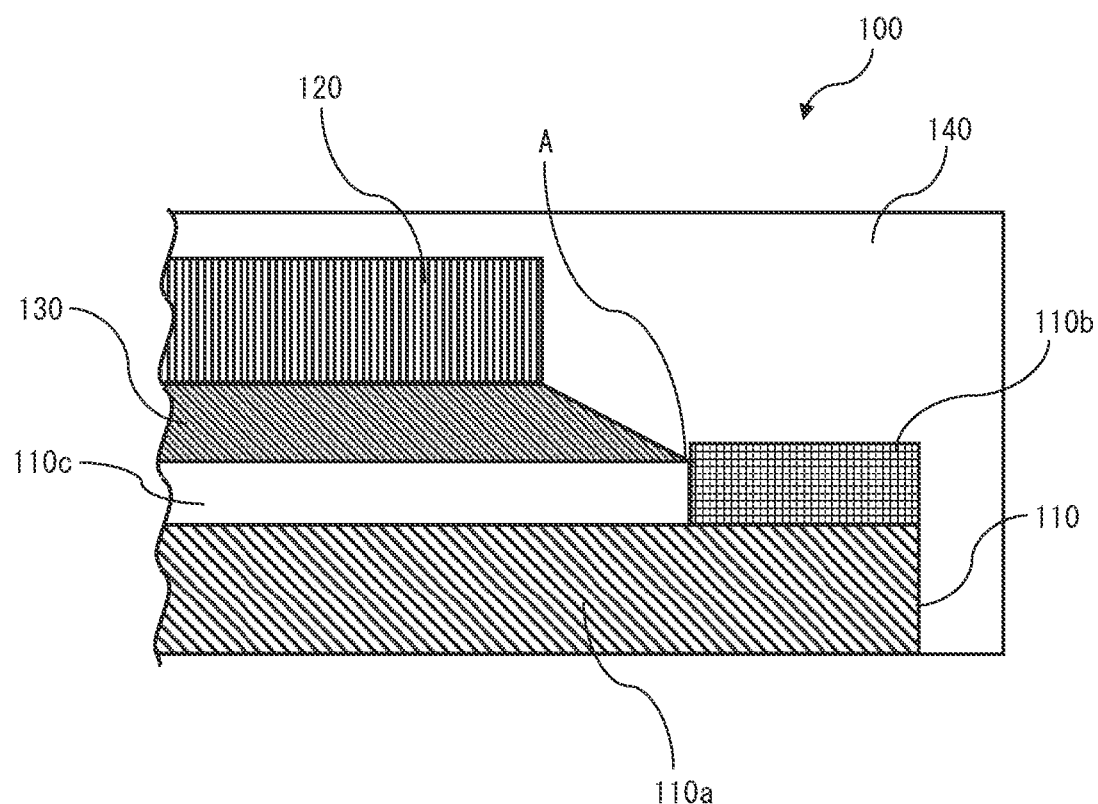
FIG. 5 is a sectional view showing a specific part of a semiconductor device in Comparative example.
Figure 6:
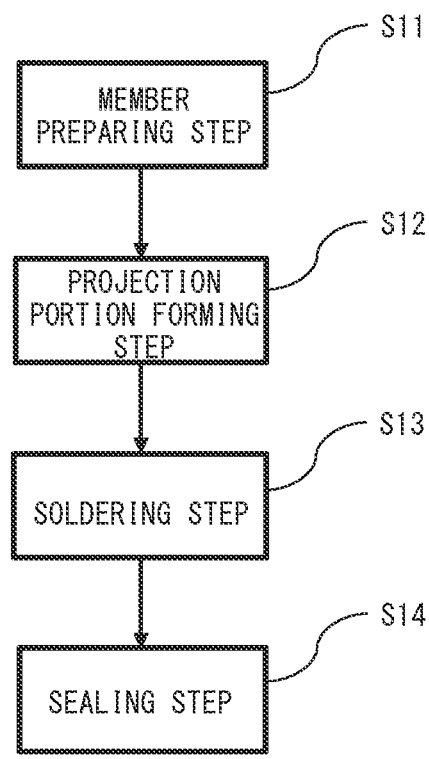
FIG. 6 is a flowchart showing a manufacturing process for the semiconductor device according to the first embodiment.

FIG. 1 is a sectional view schematically showing a semiconductor device 10 according to the first embodiment of the present disclosure, FIG. 2 is a plan view schematically showing a semiconductor element 11 of the semiconductor device 10, FIG. 3 is a sectional view showing a specific part of the semiconductor device 10, FIG. 4 is a plan view schematically showing another semiconductor element 11 of the semiconductor device 10, FIG. 5 is a sectional view showing a specific part of a semiconductor device 100 in Comparative example, and FIG. 6 is a flowchart showing a manufacturing process for the semiconductor device 10. The semiconductor device 10 is a device on which the semiconductor element 11 such as a semiconductor element for power control is mounted, and is used for a device for performing power conversion, or the like.

<Semiconductor Device 10>

The semiconductor device 10 includes the semiconductor element 11, a metal member 12, a heat spreader 16, solder 13 joining the semiconductor element 11 and the metal member 12 to each other, a joining layer 15 joining the semiconductor element 11 and the heat spreader 16 to each other, and a mold resin 14. As shown in FIG. 2, the semiconductor element 11 includes a body portion 11a formed in a plate shape, a protection film 11b provided at an outer periphery on one surface of the body portion 11a, and a metal thin film 11c provided adjacently to the inner side of the protection film 11b on the one surface of the body portion 11a. A projection portion 20 is provided at an outer periphery of the metal thin film 11c. The details of the projection portion 20 will be described later. As shown in FIG. 3, the metal member 12 is electrically joined to a surface of the metal thin film 11c on the side opposite to the body portion 11a, by the solder 13. As shown in FIG. 1, the heat spreader 16 is joined to the other surface of the body portion 11a via the joining layer 15. The mold resin 14 seals the semiconductor element 11 and the metal member 12. The mold resin 14 is, for example, epoxy resin which is a thermosetting resin, but is not limited thereto.

As the semiconductor element 11, a semiconductor element for power control such as a metal oxide semiconductor field effect transistor (MOSFET) or an insulated gate bipolar transistor (IGBT), a flyback diode, or the like is used. The semiconductor element 11 is formed with a semiconductor substrate made of a material such as silicon carbide, silicon, or gallium nitride. In the present embodiment, a configuration having one semiconductor element 11 is shown. However, without limitation thereto, the semiconductor device 10 may be configured to have a plurality of semiconductor elements 11 of several types. In the present embodiment, the semiconductor element 11 is formed in a rectangular shape, but the shape of the semiconductor element 11 is not limited to a rectangular shape.

The semiconductor element 11 has a front surface electrode on the one surface of the body portion 11a, and a back surface electrode on the other surface of the body portion 11a. These electrodes are not shown in the drawings. The protection film 11b provided in a frame shape on the front surface electrode is an insulating protection layer. The protection film 11b is formed from polyimide which is a resin material, for example. The protection film 11b has a function of keeping insulation of the front surface electrode and ensuring the withstand voltage of the semiconductor element 11.

The metal thin film 11c is a plating film mainly composed of nickel (Ni), for example. The metal thin film 11c is not limited to a plating film, and may be a metal thin film formed by vapor deposition. In a case where the metal thin film 11c is a plating film, solder wettability can be improved. In addition, corrosion resistance at the metal thin film 11c part can be improved. The plating film may have a plurality of layers. The plurality of layers are, for example, a plating film layer mainly composed of nickel and a plating layer made of gold (Au). In a case where the plating film has a plurality of layers, solder wettability can be further improved and corrosion resistance at the metal thin film 11c part can be further improved.

The heat spreader 16 is made of metal such as copper or aluminum that is excellent in thermal conductivity and has electric conductivity. The heat spreader 16 and the semiconductor element 11 are electrically and thermally joined to each other via the joining layer 15. The joining layer 15 is a material having such property that thermal conductivity is high and electric resistance is low, and is, for example, a paste material or solder mainly composed of silver. The joining layer 15 effectively transfers heat generated from the semiconductor element 11, to the heat spreader 16. Thus, heat generated from the semiconductor element 11 is dissipated to the outside via the heat spreader 16, whereby the semiconductor element 11 is effectively cooled.

COMPARATIVE EXAMPLE

Before description of the projection portion 20 which is a main part of the present disclosure, Comparative example will be described with reference to FIG. 5. FIG. 5 is an enlarged sectional view showing a specific part of the semiconductor device 100, at a position corresponding to a part enclosed by a broken line in FIG. 1. A semiconductor element 110 includes a protection film 110b provided at an outer periphery of the body portion 110a, and a metal thin film 110c provided adjacently to the inner side of the protection film 110b. A metal member 120 is electrically joined to the metal thin film 110c by solder 130. A mold resin 140 seals the semiconductor element 110 and the metal member 120.

An outer periphery of the solder 130 on the metal thin film 110c side is in contact with the inner side of the protection film 110b in addition to an end of the metal thin film 110c. This part is a multiplex point A where a plurality of materials are in contact with each other. At the multiplex point A, great stress is likely to occur when heat is generated during operation of the semiconductor device 100, due to difference in the linear expansion coefficients of the respective materials. If great stress occurs at the multiplex point A, the stress transfers through the interface between the metal thin film 110c and the protection film 110b, so that a front surface electrode (not shown) of the body portion 110a of the semiconductor element 110 is damaged, and this can lead to malfunction of the semiconductor device 100.

<Projection Portion 20>

The projection portion 20 which is a main part of the present disclosure will be described with reference to FIG. 3. FIG. 3 is an enlarged sectional view showing a specific part of the semiconductor device 10 at the part enclosed by the broken line in FIG. 1. The surface of the metal thin film 11c on the side opposite to the body portion 11a has, on at least a part of the outer periphery thereof, the projection portion 20 projecting from the surface of the metal thin film 11c, and the solder 13 is not provided on the outer peripheral side from the top of the projection portion 20. The thickness of an oxide film on the surface of the projection portion 20 of the metal thin film 11c is greater than the thickness of an oxide film on the surface of a part of the metal thin film 11c on the inner side from the projection portion 20. The thickness of the metal thin film 11c at a bottom part of the projection portion 20 on the outer peripheral side from the projection portion 20 is smaller than the thickness of the metal thin film 11c on the inner side from the projection portion 20. As shown in FIG. 2, the projection portion 20 is formed between the outer periphery of the metal thin film 11c and a part of the metal thin film 11c enclosed by a dotted-dashed line. The projection portion 20 is formed over the entire perimeter on the outer periphery of the metal thin film 11c.

The projection portion 20 is an area of the metal thin film 11c roughened and oxidized in a projection portion forming step through application of a laser beam as described later. Thus, on the outer peripheral side from the top of the projection portion 20, wetting and spreading of the solder 13 are suppressed. On the inner peripheral side from the top of the projection portion 20, the metal member 12 and the metal thin film 11c are joined to each other by the solder 13. With such a structure, it is possible to avoid formation of the multiplex point where great stress is likely to occur due to heat generation. Since formation of the multiplex point is avoided, damage of the front surface electrode can be suppressed. Even if stress due to heat generation occurs at the outer periphery on the metal thin film 11c side of the solder 13 during operation of the semiconductor device 10, the stress hardly transfers to the protection film 11b because the solder 13 and the protection film 11b are not in contact with each other, and therefore damage of the front surface electrode can be avoided. In FIG. 3, a plurality of the projection portions 20 are provided. However, the projection portion 20 may be formed only at a part where wetting and spreading of the solder 13 are required to be suppressed.

In the case where the thickness of the oxide film on the surface of the projection portion 20 of the metal thin film 11c is greater than the thickness of the oxide film on the surface of the part of the metal thin film 11c on the inner side from the projection portion 20, even when a soldering step described later has been performed, there is a sufficient amount of the oxide film on the projection portion 20 and thus wetting and spreading of the solder 13 to the outer peripheral side from the projection portion 20 can be assuredly suppressed. In the case where the thickness of the metal thin film 11c at the bottom part of the projection portion 20 on the outer peripheral side from the projection portion 20 is smaller than the thickness of the metal thin film 11c on the inner side from the projection portion 20, the metal thin film 11c is present also in the area where the projection portion 20 is formed, so that the front surface electrode is not exposed. Thus, damage of the front surface electrode due to exposure thereof can be suppressed.

In the present embodiment, the projection portion 20 is formed over the entire perimeter on the outer periphery of the metal thin film 11c. The area where the projection portion 20 is formed on the outer periphery of the metal thin film 11c is not limited to the entire perimeter on the outer periphery, and the projection portion 20 may be provided only at a necessary part of the outer periphery. For example, in a case where the semiconductor element 11 has a rectangular plate shape, as shown in FIG. 4, the projection portions 20 may be formed at corners enclosed by dotted-dashed lines on the outer periphery of the metal thin film 11c. In a case where the outer periphery of the metal thin film 11c has corners, stress due to heat generation is likely to occur at the corners. Therefore, if the projection portions 20 are formed at the corners, damage of the front surface electrode due to stress at the corners can be suppressed. In addition, since the projection portions 20 are formed only at necessary parts, productivity of the semiconductor device 10 can be improved.

It is noted that, when the projection portion 20 is formed, a solder joining area at the contact part between the metal thin film 11c and the solder 13 is reduced as compared to the semiconductor device 100 in Comparative example shown in FIG. 5. Due to reduction in the solder joining area, there is a concern about increase in electric resistance. However, such increase in electric resistance can be coped with by measures such as expanding the area of the metal thin film in advance. Therefore, no problem arises on operation of the semiconductor device 10.

<Manufacturing Method for Semiconductor Device 10>

A manufacturing method for the semiconductor device 10 will be described with reference to FIG. 6. The manufacturing method for the semiconductor device 10 includes a member preparing step (S11), a projection portion forming step (S12), a soldering step (S13), and a sealing step (S14).

The member preparing step is a step of preparing the semiconductor element 11 including the body portion 11a formed in a plate shape, the protection film 11b provided at the outer periphery on the one surface of the body portion 11a, and the metal thin film 11c provided adjacently to the inner side of the protection film 11b on the one surface of the body portion 11a, the metal member 12 for connecting the semiconductor element 11 and the outside, and the mold resin 14 for sealing the semiconductor element 11 and the metal member 12.

The projection portion forming step is a step of, on at least a part of the outer periphery on the surface of the metal thin film 11c on the side opposite to the body portion 11a, forming the projection portion 20 projecting from the surface of the metal thin film 11c. The area where the projection portion 20 is formed on the outer periphery of the metal thin film 11c may be the entire perimeter on the outer periphery or a necessary part of the outer periphery. In the projection portion forming step, a laser beam is applied to the surface of the metal thin film 11c at the part where the projection portion 20 is to be formed on the metal thin film 11c, so as to recess the part to which the laser beam has been applied, and by the recessed material of the metal thin film 11c, the projection portion 20 is formed at least on the inner side from the part to which the laser beam has been applied. In the present embodiment, a case of performing the projection portion forming step by applying a laser beam is described. However, means for forming the projection portion is not limited to application of a laser beam, and for example, the projection portion 20 may be formed by wet etching. In the case of forming the projection portion 20 by applying a laser beam, the projection portion 20 can be easily formed and thus productivity of the semiconductor device 10 can be improved.

The laser application in the projection portion forming step may be performed with the semiconductor element 11 alone, or in a state in which the semiconductor element 11 is joined to the heat spreader 16. The laser to be applied is preferably a pulse laser, but a continuous wave (CW) laser may be used. In a case of using a pulse laser, damage due to heat at a part to which the laser beam is applied is suppressed, and therefore, damage of the front surface electrode and other members can be suppressed. It is preferable that the pulse width in the case of using the pulse laser is as short as possible, in order to minimize the influence of heat due to laser application. Specifically, it is preferable that the pulse width is 10 ns or less. It is more preferable that the pulse width is 1 ps (picosecond) or 1 fs (femtosecond). It is noted that, as the pulse width becomes smaller, the cost for laser application equipment significantly increases. Therefore, in terms of productivity, a pulse width of about 10 ns is easily available.

The wavelength in the case of using the pulse laser is not particularly limited. For example, the wavelength is preferably 200 to 1500 nm. A laser beam of a short wavelength (200 to 355 nm) exhibits high absorbance to the metal material, so that working accuracy can be improved, but the cost for laser application equipment increases. A laser beam having a longer wavelength beyond the above range is not suitable for working of the metal material. A wavelength of 1064 nm is called a fundamental wavelength, and is high in versatility and is widely used in industry. Therefore, it is more preferable that the wavelength is 500 to 1100 nm.

The average output in the case of using the pulse laser is also not particularly limited. For example, the average output is preferably 0.1 to 100 W. As a laser used in laser welding or the like, a laser having high output of about several thousand W is used, but for forming the projection portion only on the surface of the metal thin film, it is not necessary to use such a high-output laser. If the average output is smaller than the above range, the projection portion cannot be formed. An output of about 20 W is the output of a laser generally used. Therefore, the average output is preferably about 1 to 20 W.

The energy density applied per unit area in the case of using the pulse laser is preferably 80 $J/cm^2$ or less. If the energy density is greater than 80 $J/cm^2$, supplied energy is excessive, and energy of the applied laser beam passes through the metal thin film 11c, thus causing deterioration, transformation, and damage of the front surface electrode at the foundation. Therefore, the energy density is preferably 80 $J/cm^2$ or less.

In a case of forming the projection portion 20 over the entire perimeter on the outer periphery of the metal thin film 11c, a laser beam is applied in a belt shape along the outer periphery of the metal thin film 11c. In a case of forming the projection portion 20 at corners of the outer periphery of the metal thin film 11c, a laser beam is applied to only the corners of the outer periphery of the metal thin film 11c. The projection portion 20 is formed only at a part where the laser beam is applied. In addition, the thickness of the oxide film at the part where the laser beam has been applied becomes greater than the thickness of the oxide film at the part where the laser beam is not applied. Therefore, the thickness of the oxide film on the surface of the projection portion 20 is greater than the thickness of the oxide film on the surface of a part of the metal thin film 11c on the inner side from the projection portion 20. Owing to the formation of the projection portion 20, wetting and spreading of the solder 13 to the outer peripheral side from the top of the projection portion 20 are suppressed. In addition, since the surface of the projection portion 20 is oxidized, wetting and spreading of the solder 13 to the outer peripheral side from the projection portion 20 are further suppressed. On the inner peripheral side from the top of the projection portion 20, the metal member 12 and the metal thin film 11c are joined to each other via the solder 13. Thus, it is possible to avoid formation of the multiplex point where great stress is likely to occur due to heat generation. It is noted that the thickness of the oxide film can be confirmed by calculating the oxygen presence ratio through elemental analysis by SEM-EDX on the oxide film.

The soldering step is a step of joining the metal member 12 to the surface of the metal thin film 11c on the inner side from the projection portion 20, by the solder 13. In the present embodiment, the soldering step is performed in a state in which the semiconductor element 11 is joined to the heat spreader 16. In a case of performing laser application with the semiconductor element 11 alone in the projection portion forming step, the soldering step is performed after the semiconductor element 11 is joined to the heat spreader 16. The solder 13 to be used is not particularly limited, but for example, a solder foil may be used. As the metal member 12, for example, a lead frame to be connected to the outside may be used.

A solder foil having a predetermined size within the range of the metal thin film 11c is placed on the metal thin film 11c of the semiconductor element 11. Then, the metal member 12 is stacked on the solder foil. Reflow is performed in the stacked state. Through the reflow, the semiconductor element 11 and the metal member 12 are joined to each other via the solder 13. On the outer peripheral side from the projection portion 20, wetting and spreading of the solder 13 are suppressed. Therefore, on the inner side from the projection portion 20, the solder 13 comes into a wetting state, so that the semiconductor element 11 and the metal member 12 are joined to each other.

The soldering step may be performed by reflow in a depressurized state under a hydrogen atmosphere. In the reflow in a depressurized state under a hydrogen atmosphere, parts of natural oxide films formed on the surfaces of the metal thin film 11c of the semiconductor element 11 and the metal member 12 can be removed through reduction. Such natural oxide films are unnecessary for soldering. Therefore, removal of the natural oxide films stabilizes soldering performance. In addition, fluxless solder can be used. Also, formation of voids inside the solder can be suppressed owing to depressurization during the reflow. It is noted that, in the case of performing reflow in a depressurized state under a hydrogen atmosphere, the oxide film on the surface of the projection portion 20 is also removed. However, since the thickness of the oxide film on the surface of the projection portion 20 is greater than the thickness of the oxide film on the surface of a part of the metal thin film 11c on the inner side from the projection portion 20, it is possible to leave the oxide film on the surface of the projection portion 20 without removing the entire oxide film. Since the oxide film is left on the surface of the projection portion 20, wetting and spreading of the solder 13 on the outer peripheral side from the projection portion 20 are further suppressed.

The sealing step is a step of sealing the semiconductor element 11 and the metal member 12 by the mold resin 14. In a case where the metal member 12 is directly connected to the outside, the semiconductor element 11 and the metal member 12 are sealed with a part of the metal member 12 exposed. In a case where the metal member 12 is connected to the outside via another member such as a wire, the semiconductor element 11 and the metal member 12 are sealed so as to be entirely covered. Prior to the sealing step, wire bonding for electrically connecting the surface of the semiconductor element 11 and an outer lead via a wire is performed as necessary. Since the projection portion 20 is formed at the outer periphery of the metal thin film 11c, adhesion between the projection portion 20 and the mold resin 14 is improved by an anchor effect at the projection portion 20 part.

As described above, in the semiconductor device 10 according to the first embodiment, the metal member 12 and the semiconductor element 11 including the body portion 11a, the protection film 11b provided at the outer periphery on the one surface of the body portion 11a, and the metal thin film 11c provided adjacently to the inner side of the protection film 11b on the one surface of the body portion 11a, are joined to each other via the solder 13. The surface of the metal thin film 11c on the side opposite to the body portion 11a has, on at least a part of the outer periphery thereof, the projection portion 20 projecting from the surface of the metal thin film 11c, and the solder 13 is not provided on the outer peripheral side from the top of the projection portion 20. Thus, wetting and spreading of the solder 13 to the outer peripheral side from the top of the projection portion 20 are suppressed, whereby it is possible to avoid formation of the multiplex point where great stress is likely to occur due to heat generation.

In the case where the thickness of the oxide film on the surface of the projection portion 20 of the metal thin film 11c is greater than the thickness of the oxide film on the surface of the part of the metal thin film 11c on the inner side from the projection portion 20, the oxide film is sufficiently provided on the projection portion 20, and thus wetting and spreading of the solder 13 to the outer peripheral side from the top of the projection portion 20 can be further suppressed. In the case where the thickness of the metal thin film 11c at the bottom part of the projection portion 20 on the outer peripheral side from the projection portion 20 is smaller than the thickness of the metal thin film 11c on the inner side from the projection portion 20, the front surface electrode is not exposed at the area where the projection portion 20 is formed, and therefore damage of the front surface electrode due to exposure thereof can be suppressed.

In the case where the metal thin film 11c is the plating film, wettability of the solder 13 can be improved and corrosion resistance at the metal thin film 11c part can be improved. In the case where the plating film has a plurality of layers, solder wettability can be further improved and corrosion resistance at the metal thin film 11c part can be further improved. In the case where the projection portion 20 is formed over the entire perimeter on the outer periphery of the metal thin film 11c, it is possible to avoid formation of the multiplex point over the entire perimeter on the outer periphery of the metal thin film 11c. In the case where the semiconductor element 11 has a rectangular plate shape and the projection portions 20 are formed at corners where stress is likely to occur due to heat generation on the outer periphery of the metal thin film 11c, the projection portions 20 are formed only at necessary parts, and thus productivity of the semiconductor device 10 can be improved.

The manufacturing method for the semiconductor device 10 according to the first embodiment includes: the member preparing step of preparing the semiconductor element 11 including the body portion 11a formed in a plate shape, the protection film 11b provided at the outer periphery on the one surface of the body portion 11a, and the metal thin film 11c provided adjacently to the inner side of the protection film 11b on the one surface of the body portion 11a, the metal member 12 for connecting the semiconductor element 11 and the outside, and the mold resin 14 for sealing the semiconductor element 11 and the metal member 12; the projection portion forming step of, on at least a part of the outer periphery on the surface of the metal thin film 11c on the side opposite to the body portion 11a, forming the projection portion 20 projecting from the surface of the metal thin film 11c; the soldering step of joining the metal member 12 to the surface of the metal thin film 11c on the inner side from the top of the projection portion 20, via the solder 13; and the sealing step of sealing the semiconductor element 11 and the metal member 12 by the mold resin 14. Therefore, in the semiconductor device 10, the solder 13 is not provided on the outer peripheral side from the top of the projection portion 20. Thus, wetting and spreading of the solder 13 to the outer peripheral side from the top of the projection portion 20 are suppressed, whereby it is possible to avoid formation of the multiplex point where great stress is likely to occur due to heat generation.

In the projection portion forming step, in the case where a laser beam is applied to the surface of the metal thin film 11c so as to recess the part to which the laser beam has been applied, and by the recessed material of the metal thin film 11c, the projection portion 20 is formed on the inner side from the part to which the laser beam has been applied, the projection portion 20 can be easily formed, and thus productivity of the semiconductor device 10 can be improved. In the case where the application intensity of the laser beam is set at an energy density of 80 J/cm$^2$ or less, it is possible to prevent a phenomenon in which the energy of the applied laser beam passes through the metal thin film 11c and thus causes deterioration, transformation, and damage of the front surface electrode at the foundation.

EXAMPLE

Figure 8:
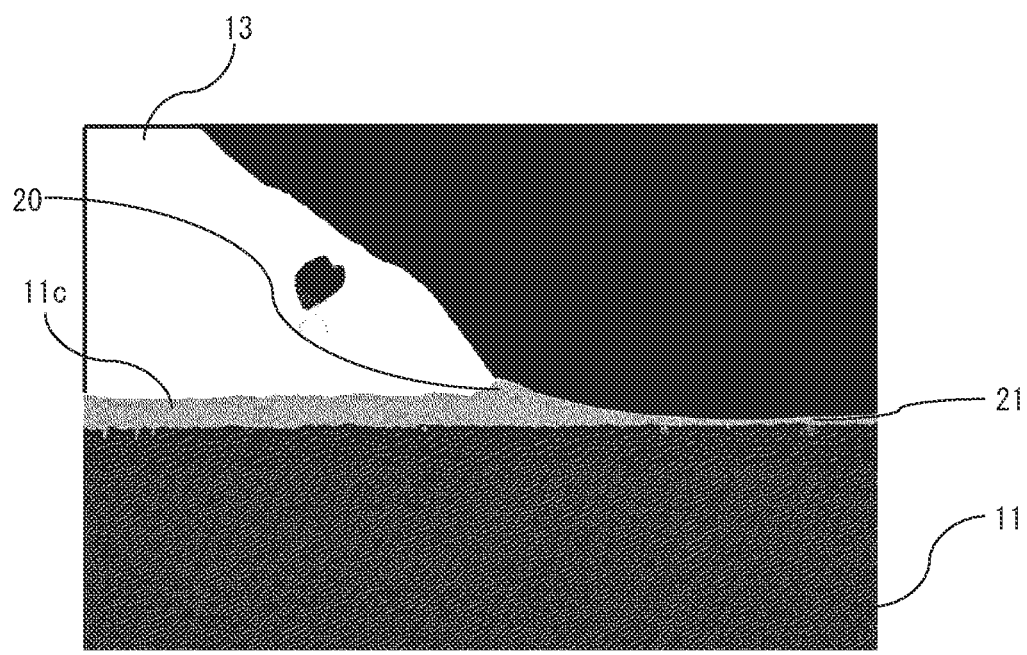
FIG. 8 is a sectional view showing a specific part regarding the evaluation result for the semiconductor device in Example.

Hereinafter, the details of the present disclosure will be specifically described on the basis of Example and Comparative example. It is noted that the present disclosure is not limited thereto. FIG. 7 shows an evaluation result for the semiconductor device 10 in Example, and FIG. 8 is a sectional view showing a specific part regarding the evaluation result for the semiconductor device 10 in Example. The evaluation was conducted on three items: suppression of solder wetting, damage of the semiconductor element, and electric property.
<Evaluation Sample>

The semiconductor element 11 used in the evaluation described later will be described. The semiconductor element 11 is joined to the heat spreader 16 made of copper. The semiconductor element 11 is an IGBT. The metal thin film 11c on the surface of the semiconductor element 11 is a plating film mainly composed of nickel, and the thickness of the plating film is about 5 µm. At the outer periphery of the metal thin film 11c, the protection film 11b mainly composed of polyimide is formed in a frame shape.

The formation step for the projection portion 20 will be described. A pulse laser beam was applied to the surface of the metal thin film 11c of the semiconductor element 11, whereby a component of the metal thin film 11c was melted and vaporized, thus forming the projection portion 20. In the pulse laser application, MX-Z2000H (wavelength: 1062 nm) manufactured by Omron Corporation was used. The frequency and the speed of an application device were adjusted so that the energy density of the applied pulse laser beam was in a range of 1.0 to 100 J/cm$^2$. Eleven values of the energy density were used and therefore eleven different evaluation samples were obtained. Using the semiconductor elements 11 with the projection portions 20 formed thereon, the following evaluation was conducted, and the evaluation result is summarized in FIG. 7. It is noted that the evaluation was conducted also for Comparative example described in the above embodiment. The evaluation result of Comparative example is shown in a column where the value of the energy density is 0 in FIG. 7.
<Suppression of Solder Wetting>

Evaluation for suppression of solder wetting will be described. On the surfaces of the metal thin films 11c of the eleven kinds of semiconductor elements 11 and the metal thin film 110c of the semiconductor element 110 in Comparative example, a predetermined amount of flux was dropped, and a solder foil (Sn-0.75Cu; M20 manufactured by Senju Metal Industry Co., Ltd.) was placed. Thereafter, the solder foil was melted at 260° C. The temperature was returned to the room temperature to solidify the solder, whereby samples for solder wettability evaluation were obtained. Each obtained sample was observed by a microscope, and solder wettability was evaluated.

In the evaluation, the sample in which the solder 13 stopped at a position up to the top of the projection portion 20 was defined as ○. The sample in which the solder 13 passed over the top of the projection portion 20 to reach the protection film 11b was defined as x. In the case where the energy density was 5 J/cm$^2$ or less, the projection portion 20 was not sufficiently formed for suppressing solder wettability, so that the solder 13 was not repelled by the area to which the laser beam was applied. However, when the laser beam with this energy density was repeatedly applied, it was expected that solder wettability could be improved, and therefore the case of 5 J/cm$^2$ or less was evaluated as Δ. In the case where the energy density was 10 J/cm$^2$ or greater, the projection portion 20 was formed and solder wettability on the outer peripheral side from the top of the projection portion 20 was suppressed. FIG. 8 shows a SEM photograph of a cross-section of the sample in which the effect of repelling the solder 13 was confirmed. It can be confirmed that the outer peripheral portion of the solder 13 is stopped by the top of the projection portion 20. In Comparative example, the projection portion 20 was not formed and therefore the evaluation result was x.
<Damage of Semiconductor Element>

Evaluation for damage of the semiconductor element will be described. The cross-sections of the eleven kinds of semiconductor elements 11 were observed by an electron microscope, to evaluate damage of each semiconductor element by application of the laser beam. The damage of the semiconductor element was determined on the basis of whether or not the metal thin film 11c was present at the part to which the laser beam was applied. In the evaluation, the sample in which the bottom of a recessed part of the metal thin film 11c adjacent to the projection portion 20 (hereinafter, referred to as recessed portion 21) did not penetrate through the metal thin film 11c was defined as ○. The sample in which the bottom of the recessed portion 21 penetrated through the metal thin film 11c to reach the front surface electrode was defined as x. In FIG. 8, the bottom of the recessed portion 21 does not penetrate through the metal thin film 11c. If the bottom of the recessed portion 21 penetrates through the metal thin film 11c by laser application and thus the front surface electrode is damaged, electric property described later and other properties of the semiconductor element might be impaired. It is important to cause no damage to the front surface electrode when applying a laser beam to the surface of the semiconductor element 11. In the case where the energy density was low, damage of the semiconductor element was not confirmed, in contrast to the evaluation result for solder wettability. On the other hand, in the case where the energy density was 85 J/cm$^2$ or greater, it was confirmed that the bottom of the recessed portion 21 penetrated through the metal thin film 11c to reach the front surface electrode. In Comparative example, a laser beam was not applied, and thus the evaluation result was ○.
<Electric Property>

Evaluation for electric property will be described. The eleven kinds of semiconductor elements 11 and the semiconductor element 110 in Comparative example were mounted and wired in such a form that evaluation for electric property could be conducted, thus preparing samples for insulation (leak current) evaluation. In the evaluation, voltage was applied between the collector and the emitter of each sample for insulation evaluation, and the sample in which leak current was not confirmed was defined as ○. The sample in which leak current was confirmed was defined as x. If the front surface electrode is damaged by laser application, insulation is broken and leak current occurs. Even when there was damage on the semiconductor elements as described above, some of such samples could keep electric property. In these samples, insulation could be kept in spite of some damage of the semiconductor elements, and therefore it is considered that these samples had tolerance as products. In the case where the energy density was 85 J/cm² or greater, the front surface electrode was significantly damaged by the laser beam, and therefore leak current was confirmed. In Comparative example, a laser beam was not applied, and thus the evaluation result was ○.

From FIG. 7 summarizing the evaluation result, it has been found that the energy density of the laser beam to be applied to the semiconductor element 11 is preferably in a range of 1 to 80 J/cm², and is more preferably in a range of 10 to 80 J/cm². When the energy density of the laser beam is set in such a range, favorable results can be obtained regarding suppression of solder wetting, damage of the semiconductor element, and electric property in the semiconductor device 10.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 10 semiconductor device
11 semiconductor element
11a body portion
11b protection film
11c metal thin film
12 metal member
13 solder
14 mold resin
15 joining layer
16 heat spreader
20 projection portion
21 recessed portion
100 semiconductor device
110 semiconductor element
110a body portion
110b protection film
110c metal thin film
120 metal member
130 solder
140 mold resin
A multiplex point

What is claimed is:

1. A semiconductor device comprising:
a semiconductor element including a body portion formed in a plate shape, a single layer of protection film provided along an outer periphery on one surface of the semiconductor body portion, and a metal thin film formed directly on said one surface of the semiconductor body portion and provided adjacently to and contacting an inner side of the single layer of protection film on the one surface of the semiconductor body portion;
a metal member joined to a surface of the metal thin film on a side opposite to the body portion, by solder; and
a mold resin sealing the semiconductor element and the metal member, wherein
the surface of the metal thin film, on its surface facing away from said body portion, on at least a part of an outer periphery thereof adjacently to the inner side of said single layer of protection film, includes a projection portion projecting from the surface of the metal thin film, wherein the projection portion stands between a part of the metal thin film on the inner side from the protection portion and the single layer of protection film, and forms a barrier preventing the solder from flowing to the outer periphery of said metal thin film, such that there is no contact between said solder and any portion of said single layer of protection film; said single layer of protection film and said projection portion being uncovered other than by said mold resin.

2. The semiconductor device according to claim 1, wherein
a thickness of surfaces of the projection portion of the metal thin film prevents wetting and spreading of the solder to an outer periphery of the projection portion.

3. The semiconductor device according to claim 1, wherein
a thickness of the metal thin film at a bottom part of the projection portion on an outer peripheral side from the projection portion is smaller than a thickness of the metal thin film on an inner side from the projection portion.

4. The semiconductor device according to claim 1, wherein
the metal thin film is a plating film.

5. The semiconductor device according to claim 4, wherein
the plating film has a plurality of layers.

6. The semiconductor device according to claim 1, wherein
the projection portion is formed over an entire perimeter on the outer periphery of the metal thin film.

7. The semiconductor device according to claim 1, wherein
the semiconductor element has a rectangular plate shape, and
the projection portion is formed only at corners of the outer periphery of the metal thin film.

8. A semiconductor device comprising:
a semiconductor element including a body portion formed in a plate shape, a single layer of protection film provided along an outer periphery on one surface of the semiconductor body portion, and a metal thin film formed directly on said one surface of the semiconductor body portion and provided adjacently to and contacting an inner edge of the single layer of protection film on the one surface of the semiconductor body portion;
a metal member joined to a surface of the metal thin film, by solder; wherein
the surface of an outer periphery of the metal thin film, on its surface facing away from said body portion, includes a projection portion projecting from the surface of the metal thin film, such that the projection portion stands between that part of the metal thin film on the inner side from the protection portion, and said single layer of protection film, and thereby forms a barrier between the solder and the single layer of protection film, such that the solder is prevented from coming into contact with both of the metal thin film and the single layer of protection film at any one point.

* * * * *